(12) United States Patent
Lee

(10) Patent No.: US 9,188,637 B2
(45) Date of Patent: Nov. 17, 2015

(54) SEMICONDUCTOR APPARATUS INCLUDING PLURALITY OF CHIPS BEING DIVIDED INTO PLURALITY OF PLANES

(75) Inventor: Jeong Woo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 196 days.

(21) Appl. No.: 13/600,177

(22) Filed: Aug. 30, 2012

(65) Prior Publication Data
US 2013/0176044 A1    Jul. 11, 2013

(30) Foreign Application Priority Data
Jan. 6, 2012    (KR) .................. 10-2012-0001993

(51) Int. Cl.
*G01R 31/3187* (2006.01)
*G01R 31/317* (2006.01)

(52) U.S. Cl.
CPC .............................. *G01R 31/31723* (2013.01)

(58) Field of Classification Search
CPC .................. G01R 31/31723; G01R 31/31926; G11C 8/16; G11C 29/14; G11C 29/46; G11C 29/48; G11C 29/56
USPC ................ 324/750.3; 713/400, 375; 438/129; 257/48
See application file for complete search history.

(56) References Cited

U.S. PATENT DOCUMENTS

| | | | |
|---|---|---|---|
| 6,539,488 B1 * | 3/2003 | Tota et al. ...................... | 713/400 |
| 6,721,913 B1 * | 4/2004 | Azimi ........................... | 714/734 |
| 2003/0198116 A1 * | 10/2003 | Sato ......................... | G11C 7/22 365/222 |
| 2004/0093544 A1 * | 5/2004 | Belzile et al. .................. | 714/742 |
| 2004/0142687 A1 * | 7/2004 | Richards et al. .............. | 455/423 |
| 2004/0184327 A1 * | 9/2004 | Okuda ......................... | 365/199 |
| 2006/0023544 A1 * | 2/2006 | Yamada ....................... | 365/222 |
| 2007/0011525 A1 * | 1/2007 | Suzuki ......................... | 714/726 |
| 2007/0070743 A1 * | 3/2007 | Do et al. ....................... | 365/201 |
| 2007/0070778 A1 * | 3/2007 | Do ........................... | 365/230.05 |
| 2007/0171738 A1 * | 7/2007 | Kim et al. ..................... | 365/201 |
| 2007/0226591 A1 * | 9/2007 | Proell ................ | G01R 31/3172 714/763 |
| 2007/0236239 A1 * | 10/2007 | Bucksch .......... | G01R 31/31926 324/750.3 |
| 2008/0052573 A1 * | 2/2008 | Pekny ........................... | 714/724 |
| 2011/0110064 A1 * | 5/2011 | Foster et al. .................. | 361/803 |
| 2012/0257461 A1 * | 10/2012 | Kim et al. ................. | 365/189.05 |
| 2013/0092936 A1 * | 4/2013 | Yang et al. ..................... | 257/48 |

* cited by examiner

*Primary Examiner* — Tung X Nguyen
*Assistant Examiner* — David Frederiksen
(74) *Attorney, Agent, or Firm* — William Park & Associates Ltd.

(57) ABSTRACT

A semiconductor apparatus includes a control chip including a first selection unit configured to output one of signals which are inputted through a first normal port and a shared test port, in response to a test mode signal; and a second selection unit configured to output one of signals which are inputted through a second normal port and the shared test port, in response to the test mode signal, wherein the control chip is configured to transmit an output of the first selection unit to a first chip and transmit an output of the second selection unit to a second chip.

6 Claims, 6 Drawing Sheets

SEMICONDUCTOR APPARATUS INCLUDING PLURALITY OF CHIPS BEING DIVIDED INTO PLURALITY OF PLANES

CROSS-REFERENCES TO RELATED APPLICATION

The present application claims priority under 35 U.S.C. §119(a) to Korean application number 10-2012-0001993, filed on Jan. 6, 2012, in the Korean Intellectual Property Office, which is incorporated herein by reference in its entirety.

BACKGROUND

1. Technical Field

The present invention generally relates to a semiconductor apparatus, and more particularly, to a stacked semiconductor apparatus.

2. Related Art

In order to improve the degree of integration of a semiconductor apparatus, a 3D (three-dimensional) semiconductor apparatus, in which a plurality of chips are stacked and packaged to increase the degree of integration, has been developed. In the 3D semiconductor apparatus, since two or more chips are vertically stacked, a maximum degree of integration may be achieved in the same area. In the 3D semiconductor apparatus, instead of improving operating frequency, a band width is increased by allocating separate channels to stacked chips.

FIG. 1 is a view schematically showing the configuration of a conventional semiconductor apparatus. In FIG. 1, the semiconductor apparatus includes first to fourth chips CHIP0 to CHIP3 and a control chip MCHIP. The control chip MCHIP may be a chip which is packaged along with the first to fourth chips CHIP0 to CHIP3 into a single package, and may perform the function of an interposer in a system-in-package including a controller.

The first to fourth chips CHIP0 to CHIP3 operate by being divided into planes. That is to say, respective chips are distinguished by planes so as to improve a band width, and separate channels are allocated to the respective planes. In FIG. 1, the first chip CHIP0 is divided into first and second planes Plane0 and Plane1, the second chip CHIP1 is divided into third and fourth planes Plane2 and Plane3, the third chip CHIP2 is divided into fifth and sixth planes Plane4 and Plane5, and the fourth chip CHIP3 is divided into seventh and eighth planes Plane6 and Plane7. The control chip MCHIP has first to eighth channels CH0 to CH7 for communicating with the first to eighth planes Plane0 to Plane7. In other words, the first channel CH0 is to communicate with the first plane Plane0 of the first chip CHIP0, and the second channel CH1 is to communicate with the second plane Plane1 of the first chip CHIP0. The remaining channels are provided to communicate with corresponding planes of corresponding chips, respectively.

The control chip MCHIP includes a plurality of ports. The plurality of ports receive signals for operating the first to fourth chips CHIP0 to CHIP3, from a controller (not shown) or a test equipment (not shown). The control chip MCHIP includes first to eighth normal ports NA0 to NA7 and first to eighth test ports DA0 to DA7. The first normal port NA0 and the first test port DA0 are connected with the first channel CH0, and the second normal port NA1 and the second test port DA1 are connected with the second channel CH1. The remaining ports are connected with corresponding channels, respectively.

The normal ports NA0 to NA7 are to receive signals for normal operations of the first to fourth chips CHIP0 to CHIP3, from the controller, and the test ports DA0 to DA7 are to receive signals for test operations of the first to fourth chips CHIP0 to CHIP3, from the controller or the test equipment. The signals include a plurality of signals such as address signals, command signals, clock signals, and so forth.

FIG. 2 is a view schematically showing the configuration of the control chip MCHIP of FIG. 1. In FIG. 2, the control chip MCHIP includes first to eighth selection units 11 to 18. The first selection unit 11 receives signals which are inputted through the first normal port NA0 and the first test port DA0, and outputs one of the signals to the first channel CH0 in response to a test mode signal TMDA. The second selection unit 12 receives signals which are inputted through the second normal port NA1 and the second test port DA1, and outputs one of the signals to the second channel CH1 in response to the test mode signal TMDA. The third selection unit 13 receives signals which are inputted through the third normal port NA2 and the third test port DA2, and outputs one of the signals to the third channel CH2 in response to the test mode signal TMDA. The fourth selection unit 14 receives signals which are inputted through the fourth normal port NA3 and the fourth test port DA3, and outputs one of the signals to the fourth channel CH3 in response to the test mode signal TMDA. The fifth to eighth selection units 15 to 18 output ones of the signals which are received through the respective ports, to the allocated channels. Since the control chip MCHIP includes the first to eighth selection units 11 to 18, the control chip MCHIP may transmit the signals inputted through the respective normal ports NA0 to NA7, to the channels CH0 to CH7 in the normal operations, and may transmit the signals inputted through the respective test ports DA0 to DA7, to the channels CH0 to CH7 in the test operations.

As described above, in the conventional semiconductor apparatus, all the selection units 11 to 18 should be connected with the normal ports NA0 to NA7 and the test ports DA0 to DA7 which are individually separated from one another. The reason to this resides in that, since the chips constituting the semiconductor apparatus operate by being divided into the planes and communicate through the separated channels, the normal operations and the test operations should be separately performed. As can be seen from the above descriptions, a large number of signals are inputted through the normal ports NA0 to NA7 and the test ports DA0 to DA7 from the controller or the test equipment. Therefore, the control chip MCHIP should have large numbers of ports and balls to receive the signals.

SUMMARY

A semiconductor apparatus which can decrease the number of ports owned by a control chip is described herein.

In an embodiment, a semiconductor apparatus includes: a control chip including a first selection unit configured to output one of signals which are inputted through a first normal port and a shared test port, in response to a test mode signal; and a second selection unit configured to output one of signals which are inputted through a second normal port and the shared test port, in response to the test mode signal, wherein the control chip is configured to transmit an output of the first selection unit to a first chip and transmit an output of the second selection unit to a second chip.

In an embodiment, a semiconductor apparatus includes: a control chip including a first selection unit configured to output one of signals which are inputted through a first normal port and a first shared test port, in response to a test mode signal; a second selection unit configured to output one of signals which are inputted through a second normal port and a second shared test port, in response to the test mode signal; a third selection unit configured to output one of signals which are inputted through a third normal port and the first shared test port, in response to the test mode signal; and a fourth selection unit configured to output one of signals which are inputted through a fourth normal port and the second shared test port, in response to the test mode signal, wherein the control chip is configured to transmit outputs of the first and second selection units to a first chip and transmit outputs of the third and fourth selection units to a second chip.

In an embodiment, a semiconductor apparatus includes: a control chip including a first selection unit configured to output one of signals which are inputted through a first normal port and a shared test port, in response to a test mode signal; and a second selection unit configured to output one of signals which are inputted through a second normal port and the shared test port, in response to the test mode signal, wherein the control chip is configured to transmit an output of the first selection unit to a first plane of a first chip or an output of the second selection unit to a second plane of the first chip in response to a channel select signal.

In an embodiment, a semiconductor apparatus includes: a control chip including a first selection unit configured to output one of signals which are inputted through a first normal port and a main test port, in response to a test mode signal; and a second selection unit configured to output one of signals which are inputted through a second normal port and the main test port, in response to the test mode signal, wherein the control chip is configured to transmit an output of the first selection unit to a first chip and transmit an output of the second selection unit to a second chip.

In an embodiment, a semiconductor apparatus includes: a control chip including a first selection unit configured to output one of signals which are inputted through a first normal port and a main test port, in response to a test mode signal; a second selection unit configured to output one of signals which are inputted through a second normal port and the main test port, in response to the test mode signal; a third selection unit configured to output one of signals which are inputted through a third normal port and the main test port, in response to the test mode signal; and a fourth selection unit configured to output one of signals which are inputted through a fourth normal port and the main test port, in response to the test mode signal, wherein the control chip is configured to transmit outputs of the first and second selection units to a first chip and transmit outputs of the third and fourth selection units to a second chip.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through various embodiments.

Figure 1:
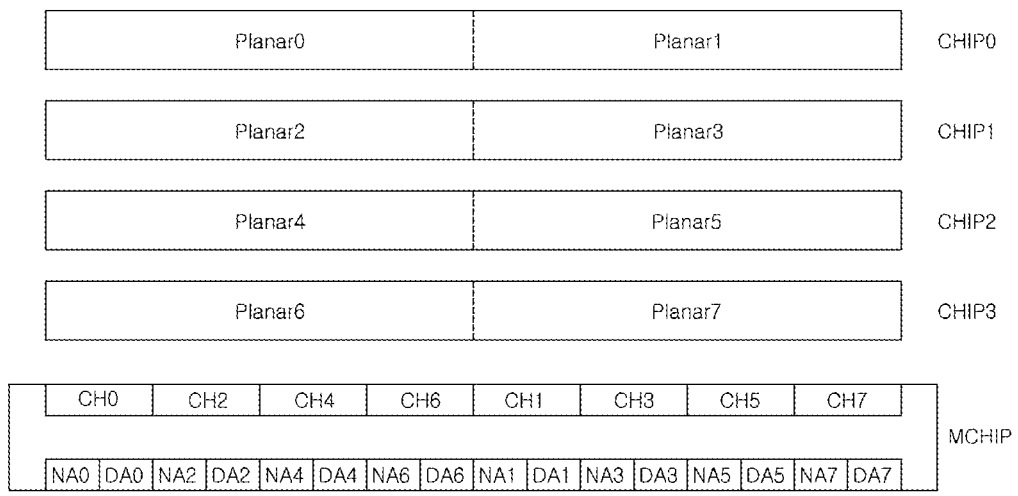
FIG. 1 is a view schematically showing the configuration of a conventional semiconductor apparatus.
Figure 2:
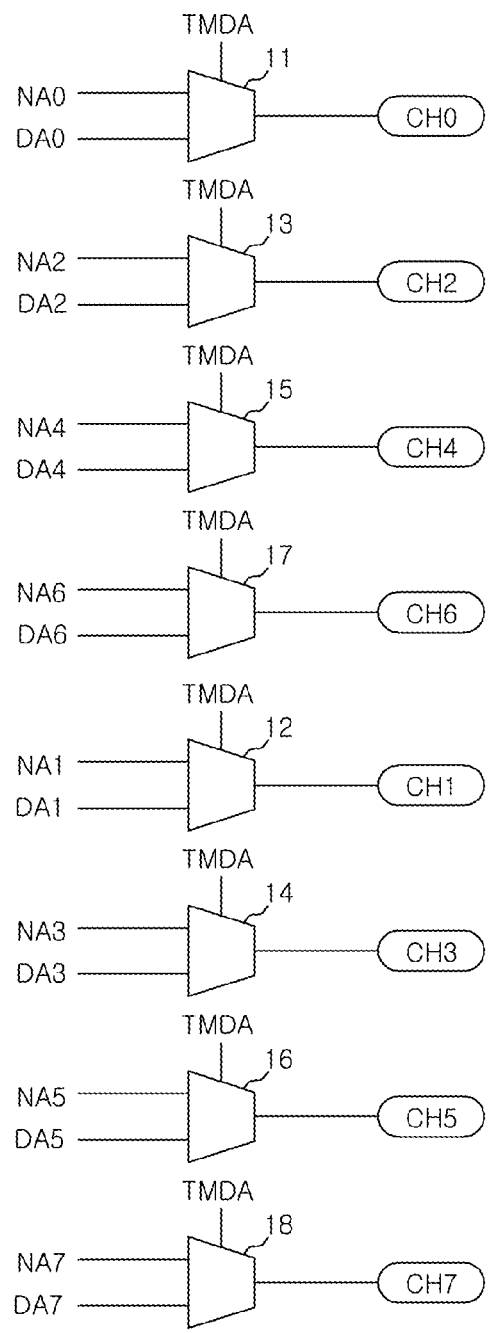
FIG. 2 is a view schematically showing the configuration of the control chip of FIG. 1.
Figure 3:
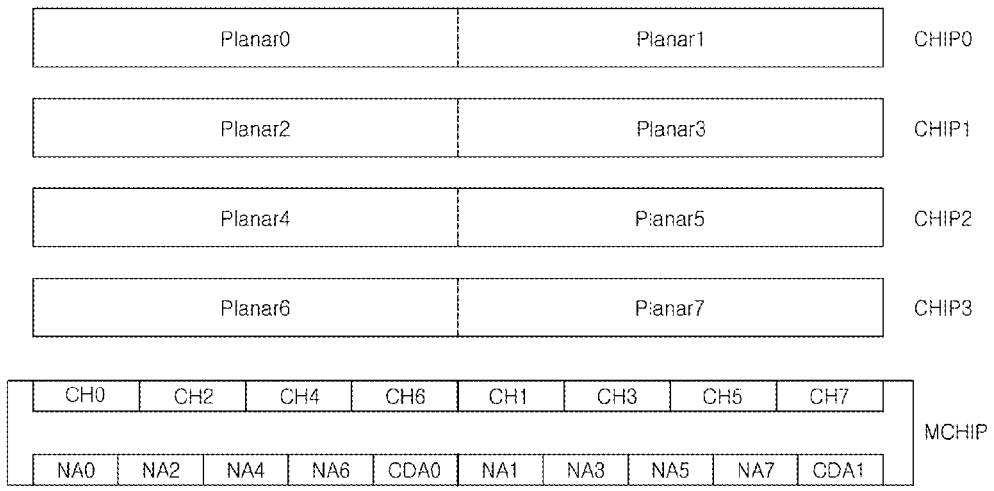
FIG. 3 is a view schematically showing the configuration of a semiconductor apparatus in accordance with an embodiment.

FIG. 3 is a view schematically showing the configuration of a semiconductor apparatus in accordance with an embodiment. In FIG. 3, a semiconductor apparatus 1 may include first to fourth chips CHIP0 to CHIP3 (CHIP0, CHIP1, CHIP2, and CHIP3) and a control chip MCHIP. The number of stacked chips is not specifically limited, and the semiconductor apparatus may include an increased number of chips. The control chip MCHIP may be a chip which interfaces the first to fourth chips CHIP0 to CHIP3 and a controller, and may be, for example, an interposer of a system-in-package.

The first to fourth chips CHIP0 to CHIP3 may operate by being divided into planes. The first chip CHIP0 may operate by being divided into first and second planes Plane0 and Plane1, the second chip CHIP1 may operate by being divided into third and fourth planes Plane2 and Plane3, the third chip CHIP2 may operate by being divided into fifth and sixth planes Plane4 and Plane5, and the fourth chip CHIP3 may operate by being divided into seventh and eighth planes Plane6 and Plane7. That is to say, in order to increase the band width of the semiconductor apparatus 1, separate channels may be allocated to the respective planes of the chips. In an embodiment, the channels may mean independent communication paths which do not share address signals, command signals, and so forth.

The control chip MCHIP may include first to eighth normal ports NA0 to NA7 and first and second shared test ports CDA0 and CDA1. The first to eighth normal ports NA0 to NA7 may receive signals which are inputted from the controller for normal operations of the semiconductor apparatus 1, and the first and second shared test ports CDA0 and CDA1 may receive signals which are inputted from the controller or a test equipment for test operations of the semiconductor apparatus 1. The signals which may be inputted to the first to eighth normal ports NA0 to NA7 and the first and second shared test ports CDA0 and CDA1 from the controller or the test equipment may include, for example, at least ones of command signals, address signals, and clock signals.

The first to eighth normal ports NA0 to NA7 may receive signals which may be transmitted to the first to eighth planes Plane0 to Plane7 of the first to fourth chips CHIP0 to CHIP3. The first shared test port CDA0 commonly receives signals which may be transmitted to the first plane Plane0 of the first chip CHIP0, the third plane Plane2 of the second chip CHIP1, the fifth plane Plane4 of the third chip CHIP2 and the seventh plane Plane6 of the fourth chip CHIP3, and the second shared test port CDA1 commonly receives signals which may be transmitted to the second plane Plane1 of the first chip CHIP0, the fourth plane Plane3 of the second chip CHIP1, the sixth plane Plane5 of the third chip CHIP2 and the eighth plane Plane7 of the fourth chip CHIP3.

The control chip MCHIP transmits one of the signals which may be inputted through the first normal port NA0 and the first shared test port CDA0, to the first plane Plane0 of the first chip CHIP0 through the first channel CH0, and transmits one of the signals which may be inputted through the second normal port NA1 and the second shared test port CDA1, to the second plane Plane1 of the first chip CHIP0 through the second channel CH1. The control chip MCHIP transmits one of the signals which may be inputted through the third normal port NA2 and the first shared test port CDA0, to the third plane Plane2 of the second chip CHIP1 through the third channel CH2, and transmits one of the signals which may be inputted through the fourth normal port NA3 and the second shared test port CDA1, to the fourth plane Plane3 of the second chip CHIP1 through the fourth channel CH3. The control chip MCHIP transmits one of the signals which may be inputted through the fifth normal port NA4 and the first shared test port CDA0, to the fifth plane Plane4 of the third chip CHIP2 through the fifth channel CH4, and transmits one of the signals which may be inputted through the sixth normal port NA5 and the second shared test port CDA1, to the sixth plane Plane5 of the third chip CHIP2 through the sixth channel CH5. Further, the control chip MCHIP transmits one of the signals which may be inputted through the seventh normal port NA6 and the first shared test port CDA0, to the seventh plane Plane6 of the fourth chip CHIP3 through the seventh channel CH6, and transmits one of the signals which may be inputted through the eighth normal port NA7 and the second shared test port CDA1, to the eighth plane Plane7 of the fourth chip CHIP3 through the eighth channel CH7.

The first to fourth chips CHIP0 to CHIP3 may operate by being divided into the planes Plane0 to Plane7, and the respective planes Plane0 to Plane7 may be allocated with separate channels. Accordingly, when it is necessary to perform tests for the respective chips, the tests should be performed separately for the respective channels. Therefore, in the conventional art, normal ports and test ports are separately provided for the respective channels. If the normal ports and the test ports are separately provided for the respective channels, the numbers of ports and balls increase, which is disadvantageous to the integration of a semiconductor apparatus. Thus, the semiconductor apparatus in accordance with an embodiment suggests a configuration in which test ports may be shared. Namely, the first, third, fifth and seventh channels CH0, CH2, CH4 and CH6 may share the first shared test port CDA0, and the second, fourth, sixth and eighth channels CH1, CH3, CH5 and CH7 may share the second shared test port CDA1. Additionally, the positions of the normal ports, the shared test ports and the channels are illustrated as an example only, and the present invention is not limited to this illustrated example.

Figure 4:
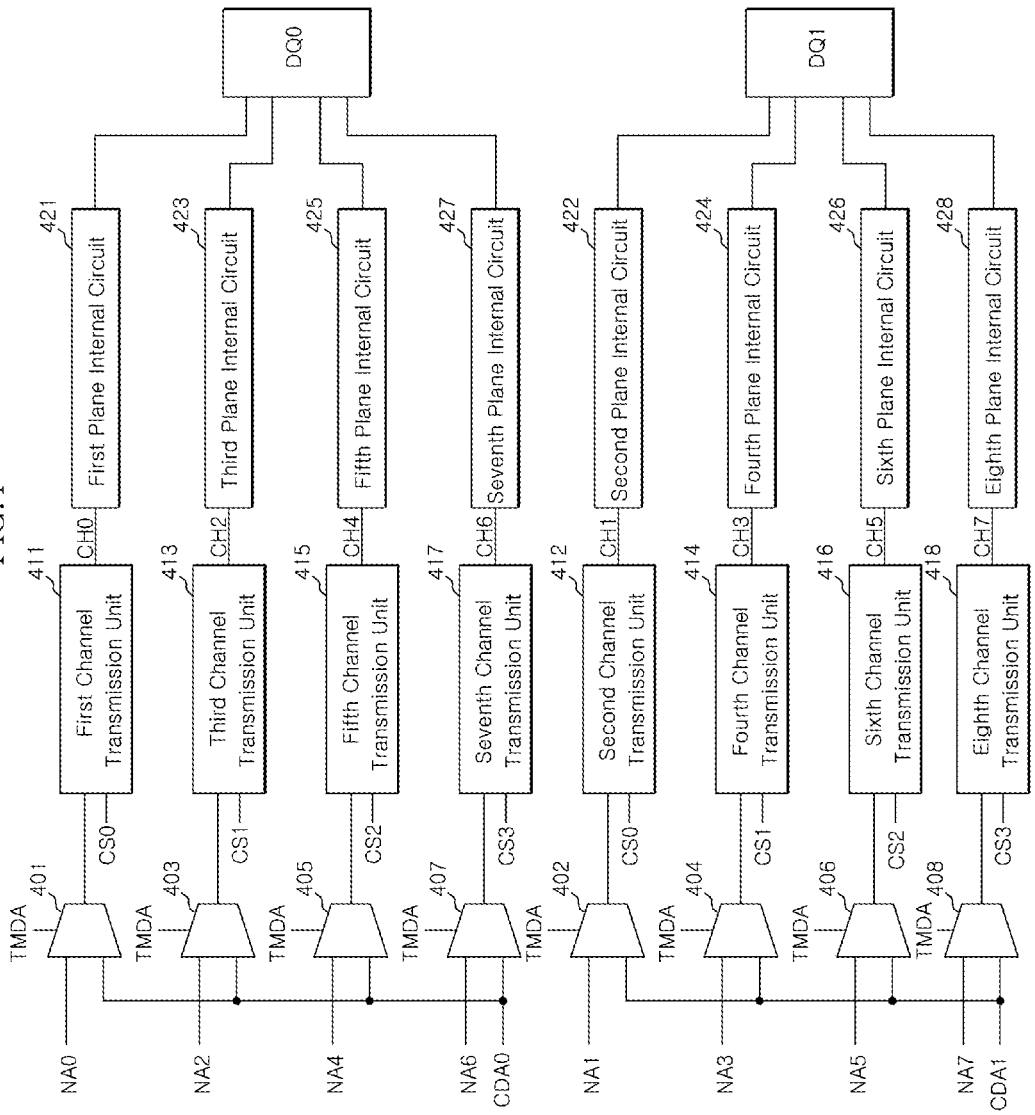
FIG. 4 is a view schematically showing the configuration of an embodiment of the control chip of FIG. 3 and the configurations of various embodiments of the respective chips which are connected through channels.

FIG. 4 is a view schematically showing the configuration of an embodiment of the control chip MCHIP of FIG. 3 and the configurations of various embodiments of the respective chips which are connected through channels. In FIG. 4, the control chip MCHIP may include first to eighth selection units 401 to 408. The first selection unit 401 may be configured to output one of the signals which may be inputted through the first normal port NA0 and the first shared test port CDA0, in response to a test mode signal TMDA. The second selection unit 402 may be configured to output one of the signals which may be inputted through the second normal port NA1 and the second shared test port CDA1, in response to the test mode signal TMDA. The test mode signal TMDA may be a signal which has information as to whether the semiconductor apparatus 1 performs a normal operation or a test operation. The control chip MCHIP may transmit the outputs of the first and second selection units 401 and 402 to the first chip CHIP0. The control chip MCHIP may transmit the output of the first selection unit 401 to the first plane Plane0 of the first chip CHIP0 through the first channel CH0 in response to a first chip select signal CS0, and may transmit the output of the second selection unit 402 to the second plane Plane1 of the first chip CHIP0 through the second channel CH1 in response to the first chip select signal CS0. In the normal operation, since the control chip MCHIP may transmit the signals inputted through the first and second normal ports NA0 and NA1, to the first and second planes Plane0 and Plane1, respectively, of the first chip CHIP0, the first and second planes Plane0 and Plane1 of the first chip CHIP0 may separately operate from each other. In the test operation, since the control chip MCHIP transmits the signals inputted through the first and second shared test ports CDA0 and CDA1, to the first and second planes Plane0 and Plane1, respectively, of the first chip CHIP0, the first and second planes Plane0 and Plane1 of the first chip CHIP0 may separately operate from each other.

The third selection unit 403 may be configured to output one of the signals which may be inputted through the third normal port NA2 and the first shared test port CDA0, in response to the test mode signal TMDA, and the fourth selection unit 404 may be configured to output one of the signals which may be inputted through the fourth normal port NA3 and the second shared test port CDA1, in response to the test mode signal TMDA. The control chip MCHIP may transmit the outputs of the third and fourth selection units 403 and 404 to the second chip CHIP1. The control chip MCHIP may transmit the outputs of the third and fourth selection units 403 and 404 to the second chip CHIP1 through the third and fourth channels CH2 and CH3 in response to a second chip select signal CS1.

The fifth selection unit 405 may be configured to output one of the signals which may be inputted through the fifth normal port NA4 and the first shared test port CDA0, in response to the test mode signal TMDA, and the sixth selection unit 406 may be configured to output one of the signals which may be inputted through the sixth normal port NA5 and the second shared test port CDA1, in response to the test mode signal TMDA. The control chip MCHIP may transmit the outputs of the fifth and sixth selection units 405 and 406 to the third chip CHIP2. The control chip MCHIP may transmit the outputs of the fifth and sixth selection units 405 and 406 to the third chip CHIP2 through the fifth and sixth channels CH4 and CH5 in response to a third chip select signal CS2.

The seventh selection unit 407 may be configured to output one of the signals which may be inputted through the seventh normal port NA6 and the first shared test port CDA0, in response to the test mode signal TMDA, and the eighth selection unit 408 may be configured to output one of the signals which may be inputted through the eighth normal port NA7 and the second shared test port CDA1, in response to the test mode signal TMDA. The control chip MCHIP may transmit the outputs of the seventh and eighth selection units 407 and 408 to the fourth chip CHIP3. The control chip MCHIP may transmit the outputs of the seventh and eighth selection units 407 and 408 to the fourth chip CHIP3 through the seventh and eighth channels CH6 and CH7 in response to a fourth chip select signal CS3.

The first to fourth chip select signals CS0 to CS3 may be signals for selectively operating the first to fourth chips CHIP0 to CHIP3. For example, the first to fourth chip select signals CS0 to CS3 may be signals which are received from the controller or the test equipment, or signals which are generated as the signals received from the controller or the test equipment are coded by the control chip MCHIP.

The control chip MCHIP further may include first to eighth channel transmission units 411 to 418. The first channel transmission unit 411 may be configured to transmit the output of the first selection unit 401 through the first channel CH0 to the first plane Plane0 of the first chip CHIP0 in response to the first chip select signal CS0. The second channel transmission unit 412 may be configured to transmit the output of the second selection unit 402 through the second channel CH1 to the second plane Plane1 of the first chip CHIP0 in response to the first chip select signal CS0. The third channel transmission unit 413 may be configured to transmit the output of the third selection unit 403 through the third channel CH2 to the third plane Plane2 of the second chip CHIP1 in response to the second chip select signal CS1. The fourth channel transmission unit 414 may be configured to transmit the output of the fourth selection unit 404 through the fourth channel CH3 to the fourth plane Plane3 of the second chip CHIP1 in response to the second chip select signal CS1. The fifth channel transmission unit 415 may be configured to transmit the output of the fifth selection unit 405 through the fifth channel CH4 to the fifth plane Plane4 of the third chip CHIP2 in response to the third chip select signal CS2. The sixth channel transmission unit 416 may be configured to transmit the output of the sixth selection unit 406 through the sixth channel CH5 to the sixth plane Plane5 of the third chip CHIP2 in response to the third chip select signal CS2. The seventh channel transmission unit 417 may be configured to transmit the output of the seventh selection unit 407 through the seventh channel CH6 to the seventh plane Plane6 of the fourth chip CHIP3 in response to the fourth chip select signal CS3. The eighth channel transmission unit 418 may be configured to transmit the output of the eighth selection unit 408 through the eighth channel CH7 to the eighth plane Plane7 of the fourth chip CHIP3 in response to the fourth chip select signal CS3.

The control chip MCHIP may transmit the outputs of the first and second selection units 401 and 402 through the first and second channels CH0 and CH1 to the first and second planes Plane0 and Plane1 of the first chip CHIP0 when the first chip select signal CS0 is activated. Also, the control chip MCHIP may transmit the outputs of the selection units through the respective channels to the planes of corresponding chips when the second to fourth chip select signals CS1 to CS3 are activated. Even though the first, third, fifth and seventh selection units 401, 403, 405 and 407 share the first shared test port CDA0 and the second, fourth, sixth and eighth selection units 402, 404, 406 and 408 share the second shared test port CDA1, since the channels may transmit the outputs of the selection units only to chips which are selectively operated by the chip select signals, it is possible to prevent the same signal from being simultaneously transmitted to different chips. Therefore, test operations may be separately performed for the channels. Moreover, since the channels connected with the planes of the respective chips may be connected with the different shared test ports, tests may be performed separately for the planes of the respective chips.

The planes Plane0 to Plane7 of the first to fourth chips CHIP0 to CHIP3 may include internal circuits 421 to 428. Each of the internal circuits 421 to 428 may include any one of a circuit for a normal operation and a circuit for a test operation. Because the first to fourth chips CHIP0 to CHIP3 operate as a single semiconductor apparatus, the first to fourth chips CHIP0 to CHIP3 may share data output ports. In particular, because the first plane Plane0, the third plane Plane2, the fifth plane Plane4, and the seventh plane Plane6 communicate through the even channels CH0, CH2, CH4, and CH6, they may be configured to share a first data output port DQ0. Further, because the second plane Plane1, the fourth plane Plane3, the sixth plane Plane5, and the eighth plane Plane7 communicate through the odd channels CH1, CH3, CH5, and CH7, they may be configured to share a second data output port DQ1.

Figure 5:
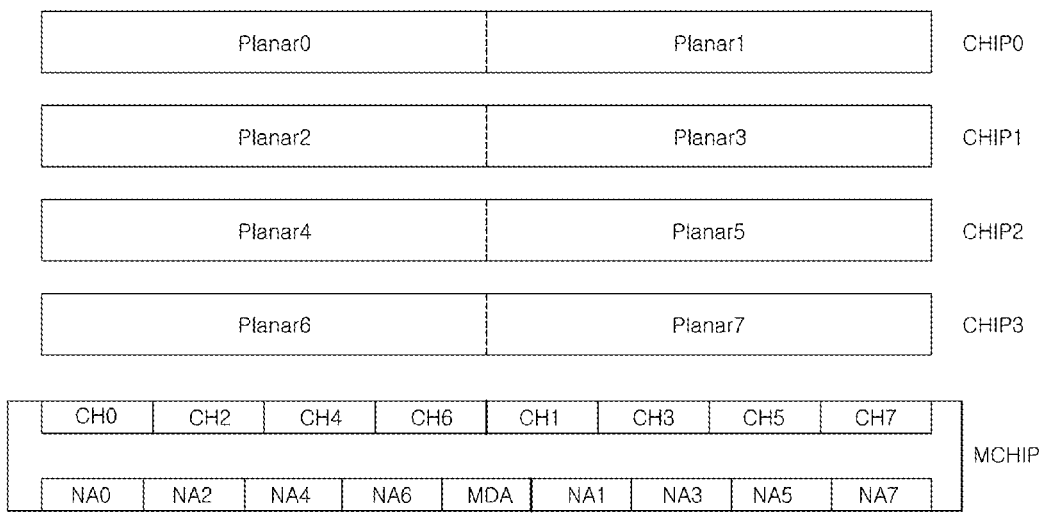
FIG. 5 is a view schematically showing the configuration of a semiconductor apparatus in accordance with an embodiment.

FIG. 5 is a view schematically showing the configuration of a semiconductor apparatus in accordance with an embodiment. In FIG. 5, a semiconductor apparatus 2 may include first to fourth chips CHIP0 to CHIP3 and a control chip MCHIP. The basic configuration of the semiconductor apparatus 2 is similar to that of the semiconductor apparatus 1 of FIG. 3.

The control chip MCHIP may include first to eighth normal ports NA0 to NA7 and a main test port MDA. Further, the control chip MCHIP may include first to eighth channels CH0 to CH7 which may communicate with first to eighth planes Plane0 to Plane7 of the first to fourth chips CHIP0 to CHIP3. The main test port MDA commonly receives signals to be transmitted to the first to eighth planes Plane0 to Plane7 of the first to fourth chips CHIP0 to CHIP3. The control chip MCHIP may transmit one of the signals which may be inputted through the first normal port NA0 and the main test port MDA, to the first plane Plane0 of the first chip CHIP0 through the first channel CH0. The control chip MCHIP may transmit one of the signals which may be inputted through the second normal port NA1 and the main test port MDA, to the second plane Plane1 of the first chip CHIP0 through the second channel CH1. The control chip MCHIP may transmit one of the signals which may be inputted through the third normal port NA2 and the main test port MDA, to the third plane Plane2 of the second chip CHIP1 through the third channel CH2. The control chip MCHIP may transmit one of the signals which may be inputted through the fourth normal port NA3 and the main test port MDA, to the fourth plane Plane3 of the second chip CHIP1 through the fourth channel CH3. Similarly, the control chip MCHIP transmit ones of the signals which may be inputted through the fifth to eighth normal ports NA4 to NA7 and the main test port MDA, to the fifth to eighth planes Plane4 to Plane7 of the third and fourth chips CHIP2 and CHIP3 through the fifth to eighth channels CH4 to CH7. In this way, since the first to eighth channels CH0 to CH7 share the main test port MDA, the area of the semiconductor apparatus 2 may be secured, and the numbers of ports and balls for receiving signals from a controller or a test equipment may be reduced.

Figure 6:
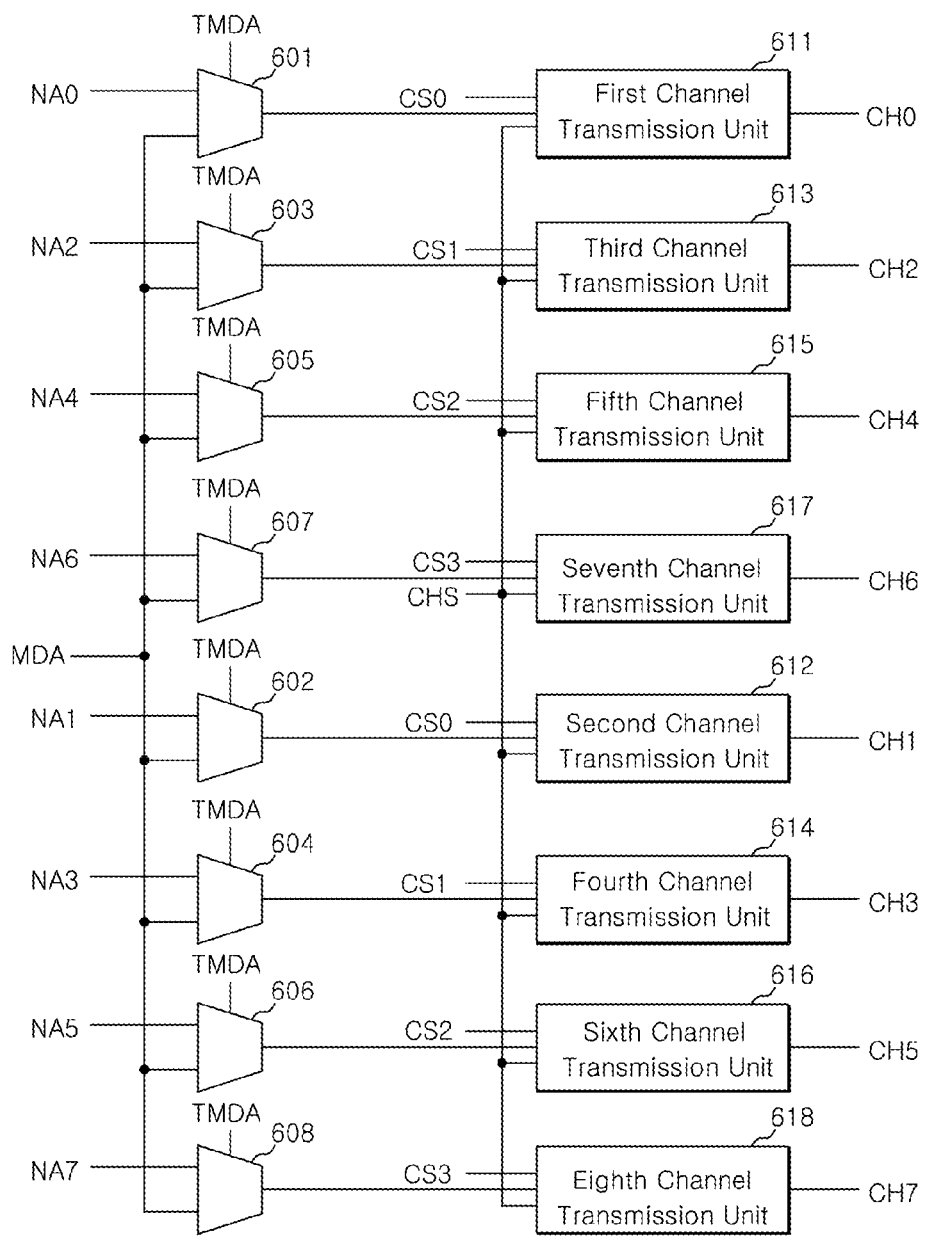
FIG. 6 is a view schematically showing the configuration of the control chip of FIG. 5.

FIG. 6 is a view schematically showing the configuration of the control chip of FIG. 5. In FIG. 6, the control chip MCHIP may include first to eighth selection units 601 to 608. The first selection unit 601 may be configured to output one of the signals which may be inputted through the first normal port NA0 and the main test port MDA. The second selection unit 602 may be configured to output one of the signals which may be inputted through the second normal port NA1 and the main test port MDA. The third selection unit 603 may be configured to output one of the signals which may be inputted through the third normal port NA2 and the main test port MDA. The fourth selection unit 604 may be configured to output one of the signals which may be inputted through the fourth normal port NA3 and the main test port MDA. The fifth selection unit 605 may be configured to output one of the signals which may be inputted through the fifth normal port NA4 and the main test port MDA. The sixth selection unit 606 may be configured to output one of the signals which may be inputted through the sixth normal port NA5 and the main test port MDA. The seventh selection unit 607 may be configured to output one of the signals which may be inputted through the seventh normal port NA6 and the main test port MDA. The eighth selection unit 608 may be configured to output one of the signals which may be inputted through the eighth normal port NA7 and the main test port MDA.

The control chip MCHIP may transmit the outputs of the first and second selection units 601 and 602 to the first chip CHIP0, transmit the outputs of the third and fourth selection units 603 and 604 to the second chip CHIP1, transmit the outputs of the fifth and sixth selection units 605 and 606 to the third chip CHIP2, and transmit the outputs of the seventh and eighth selection units 607 and 608 to the fourth chip CHIP3.

The control chip MCHIP may use chip select signals CS0 to CS3 and a channel select signal CHS to allow tests to be separately performed for the channels. The chip select signals CS0 to CS3 are as described above, and the channel select signal CHS as a signal for discriminating even channels and odd channels may be understood as a signal for selecting one plane and the other plane of each chip. The channel select signal CHS may be inputted from the controller or the test equipment.

The control chip MCHIP may transmit the outputs of the first and second selection units 601 and 602 to the first chip CHIP0 when the first chip select signal CS0 is activated. In the case where the channel select signal CHS selects an even channel, the control chip MCHIP may transmit the output of the first selection unit 601 to the first plane Plane0 of the first chip CHIP0. Conversely, in the case where the channel select signal CHS selects an odd channel, the control chip MCHIP may transmit the output of the second selection unit 602 to the second plane Plane1 of the first chip CHIP0.

The control chip MCHIP may transmit the outputs of the third and fourth selection units 603 and 604 to the second chip CHIP1 when the second chip select signal CS1 is activated. In the case where the channel select signal CHS selects an even channel, the control chip MCHIP may transmit the output of the third selection unit 603 to the third plane Plane2 of the second chip CHIP1. Conversely, in the case where the channel select signal CHS selects an odd channel, the control chip MCHIP may transmit the output of the fourth selection unit 604 to the fourth plane Plane3 of the second chip CHIP1.

The control chip MCHIP may transmit the outputs of the fifth and sixth selection units 605 and 606 to the third chip CHIP2 when the third chip select signal CS2 is activated. In the case where the channel select signal CHS selects an even channel, the control chip MCHIP may transmit the output of the fifth selection unit 605 to the fifth plane Plane4 of the third chip CHIP2. Conversely, in the case where the channel select signal CHS selects an odd channel, the control chip MCHIP transmit the output of the sixth selection unit 606 to the sixth plane Plane5 of the third chip CHIP2.

The control chip MCHIP may transmit the outputs of the seventh and eighth selection units 607 and 608 to the fourth chip CHIP3 when the fourth chip select signal CS3 is activated. In the case where the channel select signal CHS selects an even channel, the control chip MCHIP may transmit the output of the seventh selection unit 607 to the seventh plane Plane6 of the fourth chip CHIP3. Conversely, in the case where the channel select signal CHS selects an odd channel, the control chip MCHIP may transmit the output of the eighth selection unit 608 to the eighth plane Plane7 of the fourth chip CHIP3. Accordingly, in the semiconductor apparatus 2 in accordance with an embodiment, even though the first to eighth selection units 601 to 608 share the main test port MDA, signals may be transmitted through desired channels by the chip select signals CS0 to CS3 and the channel select signal CHS, tests may be performed separately for the planes of the chips which are allocated with the separate channels.

The control chip MCHIP further may include first to eighth channel transmission units 611 to 618. The first channel transmission unit 611 may be configured to transmit the output of the first selection unit 601 through the first channel CH0 to the first plane Plane0 of the first chip CHIP0 in response to the first chip select signal CS0 and the channel select signal CHS.

The second channel transmission unit 612 may be configured to transmit the output of the second selection unit 602 through the second channel CH1 to the second plane Plane1 of the first chip CHIP0 in response to the first chip select signal CS0 and the channel select signal CHS.

The third channel transmission unit 613 may be configured to transmit the output of the third selection unit 603 through the third channel CH2 to the third plane Plane2 of the second chip CHIP1 in response to the second chip select signal CS1 and the channel select signal CHS. The fourth channel transmission unit 614 may be configured to transmit the output of the fourth selection unit 604 through the fourth channel CH3 to the fourth plane Plane3 of the second chip CHIP1 in response to the second chip select signal CS1 and the channel select signal CHS.

The fifth channel transmission unit 615 may be configured to transmit the output of the fifth selection unit 605 through the fifth channel CH4 to the fifth plane Plane4 of the third chip CHIP2 in response to the third chip select signal CS2 and the channel select signal CHS. The sixth channel transmission unit 616 may be configured to transmit the output of the sixth selection unit 606 through the sixth channel CH5 to the sixth plane Plane5 of the third chip CHIP2 in response to the third chip select signal CS2 and the channel select signal CHS.

The seventh channel transmission unit 617 may be configured to transmit the output of the seventh selection unit 607 through the seventh channel CH6 to the seventh plane Plane6 of the fourth chip CHIP3 in response to the fourth chip select signal CS3 and the channel select signal CHS. The eighth channel transmission unit 618 may be configured to transmit the output of the eighth selection unit 608 through the eighth channel CH7 to the eighth plane Plane7 of the fourth chip CHIP3 in response to the fourth chip select signal CS3 and the channel select signal CHS.

In the semiconductor apparatus 2 in accordance with an embodiment, even though the respective selection units share the main test port, since signals may be transmitted through desired channels by using the chip select signals and the channel select signal, the area of a semiconductor apparatus, that is, the numbers of ports and balls for receiving signals from the controller or the test equipment, may be reduced, and tests can be performed separately for channels.

While various embodiments have been described above, it will be understood to those skilled in the art that the embodiments described are by way of example only. Accordingly, the semiconductor apparatus described herein should not be limited based on the described embodiments.

What is claimed is:
1. A semiconductor apparatus comprising:
a control chip including
a first selection unit configured to output one of signals which are inputted through a first normal port and a main test port, in response to a test mode signal;
a second selection unit configured to output one of signals which are inputted through a second normal port and the main test port, in response to the test mode signal;
a first channel transmission unit configured to transmit the output of the first selection unit to one of first and second planes of the first chip through a first channel in response to a first chip select signal and a channel select signal; and
a second channel transmission unit configured to transmit the output of the second selection unit to one of third and fourth planes of the second chip through a second channel in response to a second chip select signal and the channel select signal, wherein the first and second normal ports are connected to a controller, wherein the main test port is not connected to the controller and is connected to a test equipment.

2. The semiconductor apparatus according to claim 1, wherein each of the signals inputted through the first and second normal ports and the main test port includes at least one of a command signal, an address signal, and a clock signal.

3. A semiconductor apparatus comprising:

a control chip including a first selection unit configured to output one of signals which are inputted through a first normal port and a main test port, in response to a test mode signal;

a second selection unit configured to output one of signals which are inputted through a second normal port and the main test port, in response to the test mode signal;

a third selection unit configured to output one of signals which are inputted through a third normal port and the main test port, in response to the test mode signal; and a fourth selection unit configured to output one of signals which are inputted through a fourth normal port and the main test port, in response to the test mode signal, wherein the first to fourth normal ports are connected to a controller, wherein the main test port is not connected to the controller and is connected to a test equipment, wherein the first chip operates by being divided into first and second planes, and wherein the control chip further includes:

a first channel transmission unit configured to transmit the output of the first selection unit to the first plane of the first chip through a first channel in response to a first chip select signal and a channel select signal; and a second channel transmission unit configured to transmit the output of the second selection unit to the second plane of the first chip through a second channel in response to the first chip select signal and the channel select signal.

4. The semiconductor apparatus according to claim 3, wherein each of the signals inputted through the first to fourth normal ports and the main test port includes at least one of a command signal, an address signal, and a clock signal.

5. The semiconductor apparatus according to claim 3, wherein the first chip operates by being divided into first and second planes, and the second chip operates by being divided into third and fourth planes, wherein the control chip transmits the outputs of the first and second selection units to the first chip or the outputs of the third and fourth selection units to the second chip, in response to first and second chip select signals, and wherein the control chip transmits the outputs of the first and third selection units to the first plane of the first chip and the third plane of the second chip or the outputs of the second and fourth selection units to the second plane of the first chip and the fourth plane of the second chip, in response to a channel select signal.

6. The semiconductor apparatus according to claim 3, wherein the second chip operates by being divided into third and fourth planes, and wherein the control chip further includes:

a third channel transmission unit configured to transmit the output of the third selection unit to the third plane of the second chip through a third channel in response to a second chip select signal and the channel select signal; and a fourth channel transmission unit configured to transmit the output of the fourth selection unit to the fourth plane of the second chip through a fourth channel in response to the second chip select signal and the channel select signal.

\* \* \* \* \*